United States Patent
Ahn et al.

(10) Patent No.: US 10,014,446 B2
(45) Date of Patent: Jul. 3, 2018

(54) CHIP SUBSTRATE

(71) Applicant: POINT ENGINEERING CO., LTD., Asan-si (KR)

(72) Inventors: Bum Mo Ahn, Suwon-si (KR); Seung Ho Park, Hwaseong-si (KR); Tae Hwan Song, Cheonan-si (KR)

(73) Assignee: POINT ENGINEERING CO., LTD., Asan-si (KR)

( * ) Notice: Subject to any disclaimer, the term of this patent is extended or adjusted under 35 U.S.C. 154(b) by 0 days.

(21) Appl. No.: 15/363,261

(22) Filed: Nov. 29, 2016

(65) Prior Publication Data
US 2017/0162754 A1    Jun. 8, 2017

(30) Foreign Application Priority Data

Dec. 2, 2015   (KR) .......................... 10-2015-0170421

(51) Int. Cl.
*H01L 33/48*    (2010.01)
*H01L 33/60*    (2010.01)
*H01L 33/62*    (2010.01)

(52) U.S. Cl.
CPC ............ *H01L 33/486* (2013.01); *H01L 33/60* (2013.01); *H01L 33/62* (2013.01); *H01L 2224/48091* (2013.01)

(58) Field of Classification Search
None
See application file for complete search history.

(56) References Cited

U.S. PATENT DOCUMENTS

| 7,442,564 B2 * | 10/2008 | Andrews | H01L 33/62 257/E21.499 |
| 8,513,680 B2 * | 8/2013 | Kim | H01L 33/62 257/666 |
| 8,757,833 B2 * | 6/2014 | You | H01L 33/486 362/235 |
| 9,768,369 B2 * | 9/2017 | Ahn | H01L 33/62 |

(Continued)

FOREIGN PATENT DOCUMENTS

| JP | 2005235841 | 9/2005 |
| JP | 2011181794 | 9/2011 |

(Continued)

OTHER PUBLICATIONS

Korean Office Action—Korean Application No. 10-2015-0170421 dated Aug. 12, 2016, citing 10-2015-0130153 and KR 10-2013-0055222.

(Continued)

*Primary Examiner* — Eugene Lee
(74) *Attorney, Agent, or Firm* — Cantor Colburn LLP

(57) ABSTRACT

A chip substrate includes conductive layers, an insulation layer configured to electrically isolate the conductive layers, and a cavity composed of a groove formed at a predetermined depth in a region including the insulation layer. One side of the cavity includes a first surface and a second surface continuously extending from the first surface, the first surface is formed to vertically extend from a lower portion of the cavity and the second surface is formed so as to have the same slope as the other side of the cavity, whereby the distance between one side of the lower portion of the cavity and the insulation layer is increased.

1 Claim, 4 Drawing Sheets

(56) References Cited

U.S. PATENT DOCUMENTS

| | | | | |
|---|---|---|---|---|
| 2003/0102481 A1* | 6/2003 | Isoda | ................... | H01L 33/486 257/79 |
| 2004/0150335 A1* | 8/2004 | Horiuchi | ............... | H01L 33/486 313/512 |
| 2005/0280017 A1* | 12/2005 | Oshio | ................... | H01L 33/62 257/99 |
| 2006/0246617 A1* | 11/2006 | Lee | ................... | H01L 33/486 438/26 |
| 2007/0176196 A1* | 8/2007 | Kim | ................... | H01L 33/50 257/99 |
| 2008/0186712 A1* | 8/2008 | Chen | ................... | H01L 33/60 362/297 |
| 2009/0294793 A1* | 12/2009 | Kim | ................... | H01L 33/647 257/99 |
| 2011/0241030 A1 | 10/2011 | Kim | | |
| 2014/0070259 A1* | 3/2014 | Yoon | ................... | H01L 33/52 257/99 |
| 2014/0367718 A1* | 12/2014 | Park | ................... | H01L 33/486 257/98 |
| 2015/0221623 A1* | 8/2015 | Tischler | ................ | H01L 25/165 257/89 |

FOREIGN PATENT DOCUMENTS

| | | |
|---|---|---|
| JP | 2013251384 | 12/2013 |
| KR | 1020130055222 | 5/2013 |
| KR | 101541035 | 8/2015 |
| KR | 1020150130153 | 11/2015 |
| WO | 2014128003 | 8/2014 |

OTHER PUBLICATIONS

European Search Report—European Application No. 16200768.6, dated Feb. 2, 2017, citing US 2011/241030, JP 2011 181794, JP 2005 235841, JP 2013 251384 and WO 2014/128003.

* cited by examiner

CHIP SUBSTRATE

CROSS-REFERENCE TO RELATED PATENT APPLICATION

This U.S. non-provisional patent application claims priority under 35 U.S.C. § 119 of Korean Patent Application No. 10-2015-0170421 filed on Dec. 2, 2015 in the Korean Patent Office, the entire contents of which are hereby incorporated by reference.

TECHNICAL FIELD

The present invention relates to a chip substrate and, more particularly, to a chip substrate on which an optical element chip having a large light emission area and a large light output can be mounted without increasing the size of the chip substrate or the size of a cavity formed in the chip substrate.

BACKGROUND

A light emitting diode is used as a light source of a backlight unit for a liquid crystal display used in a flat panel display such as a television set, a monitor or the like.

Optical element chips such as light emitting diodes or the like are mounted on a raw chip plate for optical devices. Unit optical devices are manufactured through a process of separating, namely sawing or dicing, the raw chip plate for optical devices.

As an example, Korean Patent Registration No. 1,541,035 (Patent Document 1) owned by the present applicant or the present inventor discloses a configuration of a raw chip plate which does not generate burrs in a process of separating, namely sawing or dicing, the raw chip plate into optical devices.

As illustrated in FIG. 1, a raw chip plate includes a plurality of conductive layers A and A' laminated in one direction, at least one insulation layer B alternately laminated with the conductive layers A and A' to electrically isolate the conductive layers A and A', and a cavity D formed in a groove shape at a predetermined depth in a region of an upper surface of the raw chip plate including the insulation layer B, the cavity D having an inclination angle θ.

Pursuant to a customer's request, there may be a need to use an optical element chip larger in size than the optical element chip illustrated in FIG. 1, under the condition that the overall size of a chip substrate and the size, depth and reflection angle of the cavity D formed in the chip substrate remains the same.

The optical element chip is positioned at the center of the cavity D. Due to the existence of the insulation layer B positioned at the left side on the basis of FIG. 1, there is a limit in the size of the optical element chip that can be employed.

In other words, if the insulation layer B is disposed as illustrated in FIG. 1 (if the insulation layer B is not further moved to the left side) in order to provide a wire bonding region for electrically interconnecting the optical element chip and the conductive layer A, a problem is posed in that the increase in the size of the optical element chip is very small.

In the case where the formation position of the insulation layer B on the chip substrate is further moved to the left side (on the basis of the cross section illustrated in FIG. 2) in order to mount an optical element chip having a larger size on the cavity D, the following problem is posed.

Specifically, when the size of the optical element chip is increased in the related art as illustrated in FIG. 2, the formation position of the insulation layer B needs to be moved to the left side. In this case, there is posed a problem in that a wire bonding region for electrically interconnecting the optical element chip and the conductive layer A becomes quite narrow.

Under the circumstances, a demand has existed for the technical development of a chip substrate capable of not only increasing the size of the optical element chip and sufficiently providing a wire bonding region for electrically interconnecting the optical element chip and the conductive layer A.

PRIOR ART DOCUMENTS

Patent Documents

Patent document 1: Korean Patent Registration No. 1,541,035

SUMMARY

In view of the necessity for technical development described above, the present invention provides a chip substrate capable of not only increasing the size of an optical element chip mounted within a cavity and sufficiently providing a wire bonding region for electrically interconnecting an optical element chip and a conductive layer.

According to one aspect of the present invention, there is provided a chip substrate, including: conductive layers; an insulation layer configured to electrically isolate the conductive layers; and a cavity composed of a groove formed at a predetermined depth in a region including the insulation layer, wherein a curvature of one side of a lower portion of the cavity and a curvature of the other side of the lower portion of the cavity are set to become different from each other.

In the chip substrate, the curvature of one side of the lower portion of the cavity on the basis of the insulation layer may be set to become larger than the curvature of the other side of the lower portion of the cavity.

The chip substrate may further include: an optical element chip disposed at a center of the lower portion of the cavity.

In the chip substrate, a wire extending between the optical element chip and the conductive layer may be bonded to the conductive layer between one side of the lower portion of the cavity and the insulation layer.

In the chip substrate, one side of the cavity may include a first surface vertically extending from a lower surface of the cavity and a second surface continuously extending from the first surface and having a slope.

According to another aspect of the present invention, there is provided a chip substrate, including: conductive layers; an insulation layer configured to electrically isolate the conductive layers; and a cavity composed of a groove formed at a predetermined depth in a region including the insulation layer, wherein the insulation layer is shifted to one side from the center of the cavity, the distance between the center of the cavity and one side of the lower portion of the cavity is larger than the distance between the center of the cavity and the other side of the lower portion of the cavity, and the distance between the center of the cavity and one side of the upper portion of the cavity is equal to the distance between the center of the cavity and the other side of the upper portion of the cavity.

The chip substrate according to the present invention has the following effects.

(1) An optical element chip having a large light emission area and a large light output can be easily mounted on a chip substrate without increasing the size of the chip substrate or the size of the cavity formed in the chip substrate.

(2) It is possible to sufficiently provide a wire bonding region for electrically interconnecting an optical element chip and a conductive layer.

DETAILED DESCRIPTION

Figure 1:
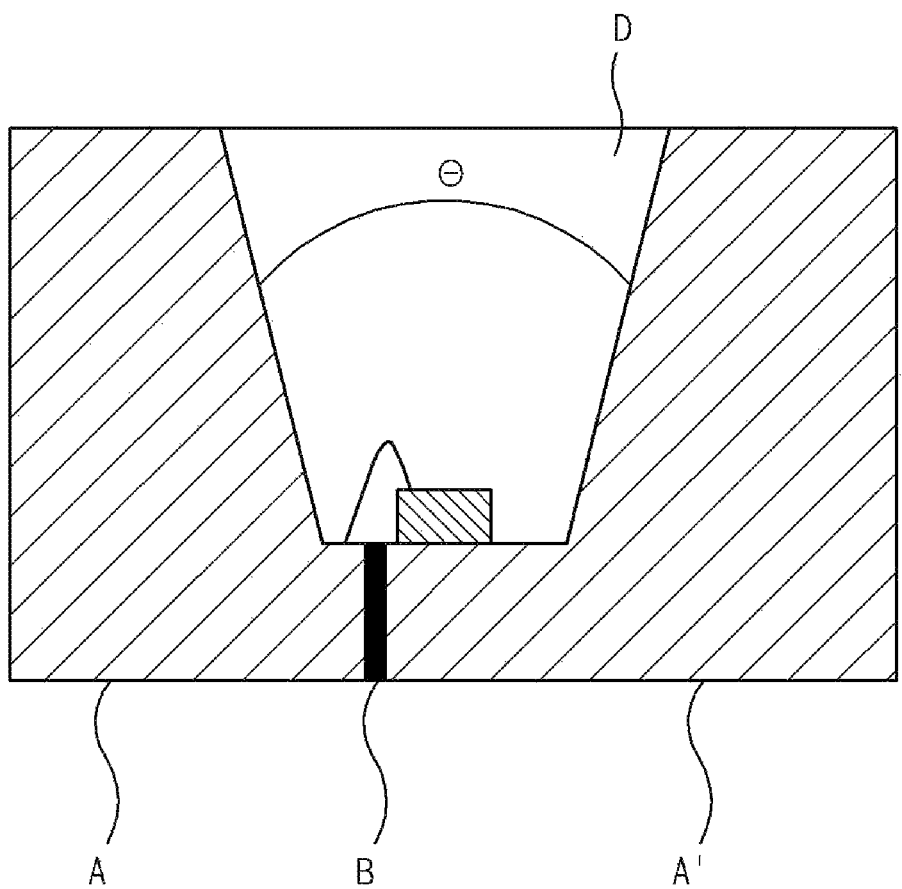
FIG. 1 is a sectional view of a chip substrate of related art.
Figure 2:
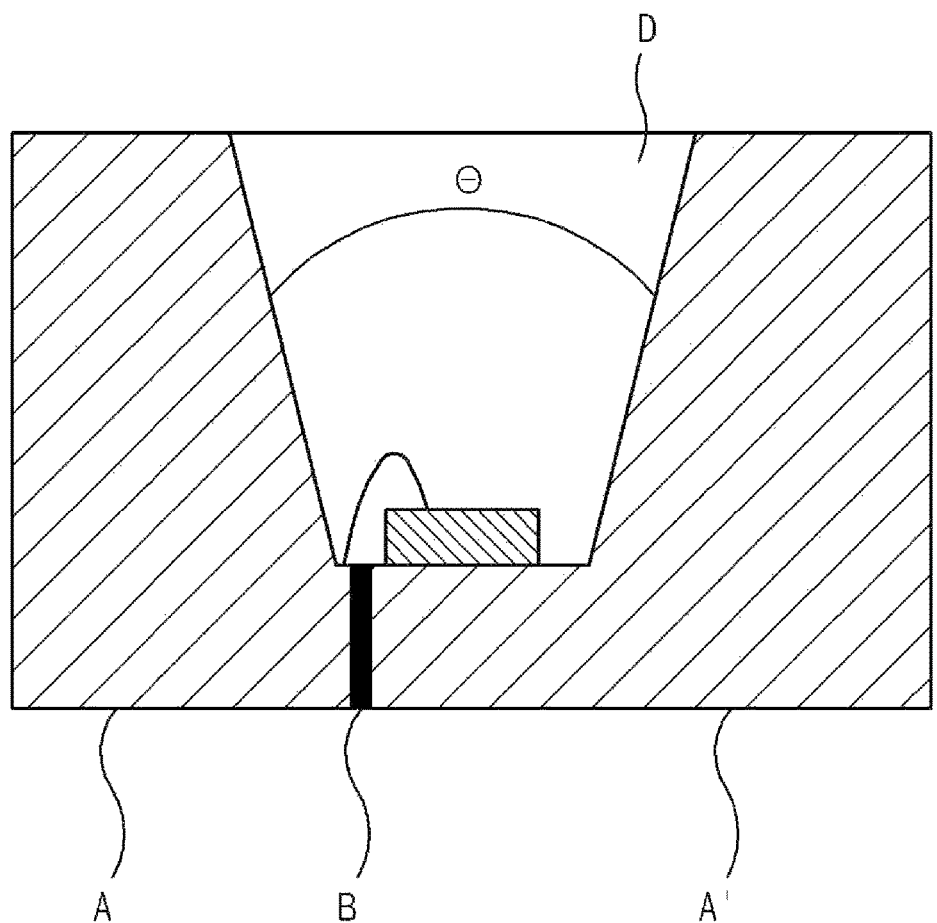
FIG. 2 is a sectional view of the chip substrate of related art.

Preferred embodiments of the present invention will now be described in detail with reference to the accompanying drawings.

As for the descriptions on a raw chip plate and a chip substrate, the disclosure of Korean Patent Registration No. 1,541,035 is incorporated herein by reference. Detailed descriptions thereof will be omitted herein.

For reference, a raw chip plate is a chip substrate array composed of a plurality of chip substrates having a predetermined size. When in use, the raw chip plate is cut into individual chip substrates.

A chip substrate 10 according to an embodiment of the present invention includes conductive layers A and A' and an insulation layer B. The insulation layer B is positioned between the conductive layers A and A' to electrically isolate the conductive layers A and A'. That is to say, the conductive layers A and A' insulated by the insulation layer B interposed therebetween may serve as a positive electrode terminal and a negative electrode terminal.

The chip substrate 10 according to the present embodiment includes a cavity D which is a space composed of a groove formed at a predetermined depth in a region including the insulation layer B.

It is preferred that the cavity D is formed in such a shape that the width thereof grows smaller downward from the upper surface of the chip substrate 10. Thus, the cavity D includes a lower portion 43 having a small width and an upper portion 53 having a large width.

After an optical element chip 20 is disposed at the center of the lower portion of the cavity D, a wire 50 is bonded between the conductive layer A, which is one of the conductive layers A and A' isolated by the insulation layer B, and the optical element chip 20.

Another electrode of the optical element chip 20 is electrically connected to the remaining conductive layer A', to which the wire 50 is not bonded. The optical element chip 20 is positioned on the conductive layer A', to which the wire 50 is not bonded.

One embodiment of the present invention will be described in detail with reference to FIG. 4.

First, a reflection angle of the cavity D is assumed to be theta $\Theta$. In one embodiment of the present invention, a curvature of one side 47 of a lower portion of the cavity D and a curvature of the other side of the lower portion of the cavity D are set to become different from each other, while maintaining the reflection angle $\Theta$ of the cavity D.

Figure 4:
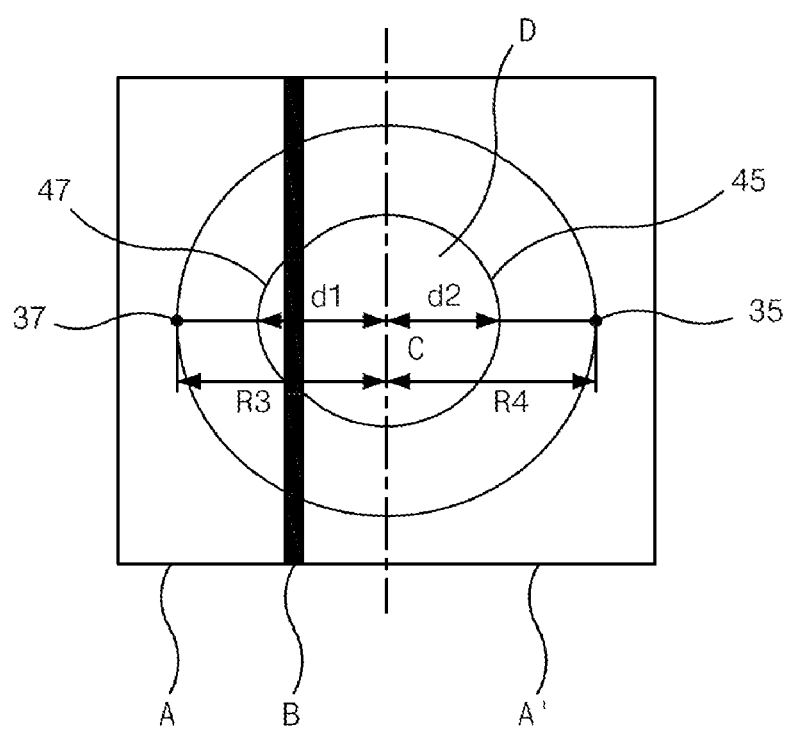
FIG. 4 is a plan view of the chip substrate according to the present invention.

FIG. 4 is a plan view illustrating the chip substrate 10 according to the present invention.

The curvature of one side 47 of the lower portion of the cavity D on the basis of the insulation layer B is set to become larger than the curvature of the other side 40 of the lower portion of the cavity D.

The curvature of one side 47 of the lower portion of the cavity D (at the left side on the basis of FIG. 4) is set to become larger. In this way, the shape of the lower portion 43 of the cavity D is formed so that the curvature of the lower portion of the cavity D is changed on the basis of the insulation layer B.

Referring to FIG. 4 which is a plan view, the curvature of one side 47 of the lower portion of the cavity D is set to become larger. Thus, one side 47 of the lower portion of the cavity D is shaped to protrude from the insulation layer B.

Figure 3:
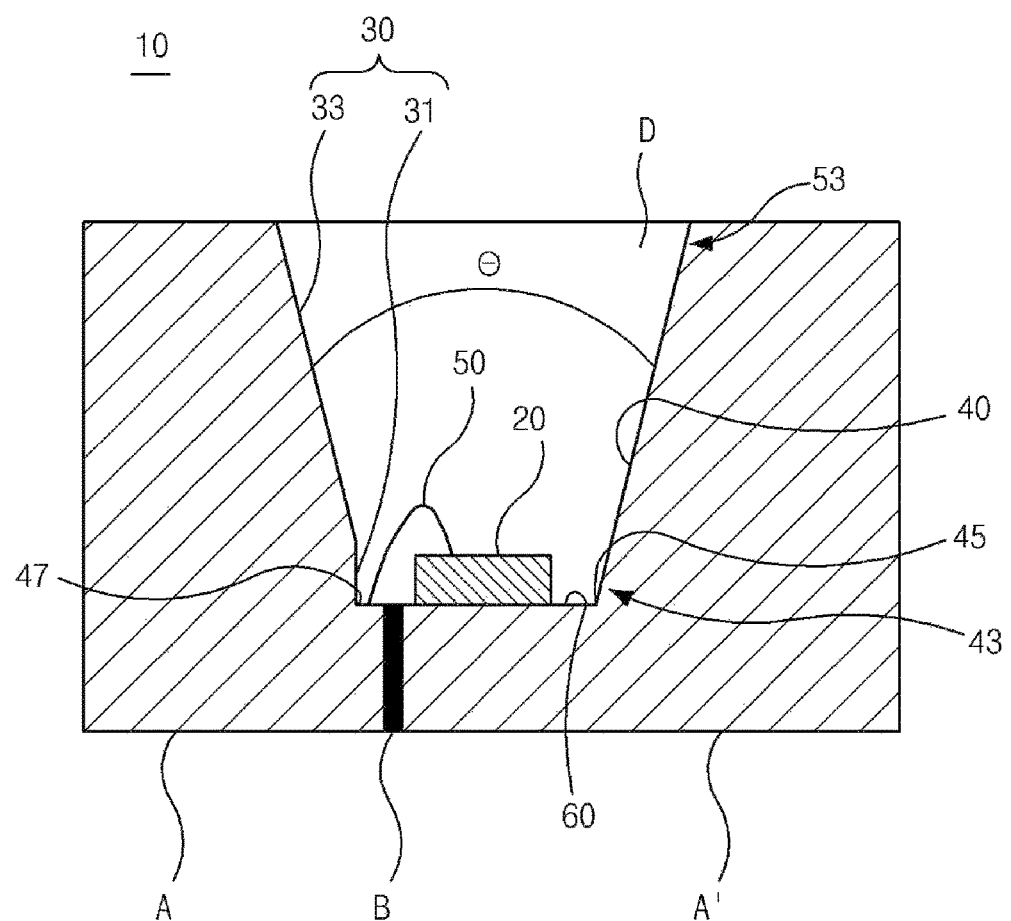
FIG. 3 is a sectional view of a chip substrate according to the present invention.

Referring to FIG. 3 which is a sectional view, a space between an imaginary extension line of a second surface 33 forming a part of one side 30 of the cavity D and a first surface 31 forming another part of one side 30 of the cavity D protrudes from the insulation layer B in a plan view.

Descriptions will be made in more detail with reference to FIG. 3 which is a sectional view.

One side 30 of the cavity D positioned at the left side of the insulation layer B includes a first surface 31 vertically extending from a lower surface 60 of the cavity D. Furthermore, one side 30 of the cavity D includes a second surface 33 continuously extending from the first surface 31.

In one embodiment of the present invention, the first surface 31 extending upward from the lower portion of the cavity D is formed to vertically extend from the lower portion of the cavity D. In this case, the second surface 33 is formed to have the same slope as that of the other side 40 of the cavity D.

By forming the second surface 33, which is a part of one side 30 of the cavity D, so as to have the same slope as that of the other side 40 of the cavity D in this way, it is possible to maintain the reflection angle $\Theta$ of the cavity D. For example, the length of the first surface 31 is set to become shorter than the length of the second surface 33.

By forming the first surface 31, which is a part of one side 30 of the cavity D, so as to extend vertically upward from the lower portion of the cavity D, it is possible to provide a space (a gap between one side 47 of the lower portion of the cavity D and the insulation layer B) large enough to bond the wire 50 extending from the optical element chip 20 to the conductive layer A.

Specifically, the wire 50 extending between the optical element chip 20 and the conductive layer A is bonded to the conductive layer A between one side 47 of the lower portion of the cavity D and the insulation layer B.

Another embodiment of the intake port 110 will now be described.

A chip substrate 10 according to another embodiment of the present invention includes conductive layers A and A' and an insulation layer B configured to electrically isolate the conductive layers A and A'.

The chip substrate 10 further includes a cavity D which is composed of a groove formed at a predetermined depth in a region including the insulation layer B.

The insulation layer B is shifted at one side from the center C of the cavity D. In the present embodiment, the insulation layer B is shifted toward one side 47 of the lower portion of the cavity D.

Referring to FIG. 4 which is a plan view, in the chip substrate 10 according to the present embodiment, the distance d1 between the center C of the cavity D and one side 47 of the lower portion of the cavity D is set to become larger than the distance d2 between the center C of the cavity D and the other side 45 of the lower portion of the cavity D.

Furthermore, the distance R3 between the center C of the cavity D and one side 37 of the upper portion of the cavity D is set to become equal to the distance R4 between the center C of the cavity D and the other side 35 of the upper portion of the cavity D.

With this configuration, the upper portion 53 of the cavity D forms a true circle. On the other hand, one side 47 of the lower portion 43 of the cavity D is spaced apart from the center C of the cavity D by a larger distance than the other side 45.

According to the chip substrate of the present invention, the optical element chip having a large light emission area and a large light output can be mounted on the chip substrate without increasing the size of the chip substrate or the size of the cavity formed in the chip substrate.

While preferred embodiments of the present invention have been described above, a person skilled in the relevant technical field will be able to diversely change or modify the present invention without departing from the spirit and scope of the present invention defined in the claims.

What is claimed is:

1. A chip substrate, comprising:
   a first conductive layer and a second conductive layer;
   an insulation layer disposed between the first conductive layer and the second conductive layer, and configured to electrically isolate the first conductive layer and the second conductive layer from each other;
   a cavity formed in a region including the first conductive layer, the second conductive layer and the insulation layer, and having a predetermined depth and a circular cross-section, wherein the cavity has a bottom surface exposing the insulation layer, a first inclined side surface formed in the first conductive layer and a second inclined side surface formed in the second conductive layer, the first inclined side surface and the second inclined side surface making the circular cross-section gradually larger upwardly from the bottom surface;
   an optical element chip disposed at a center of the bottom surface; and
   a wire electrically connecting the optical element chip and the first conductive layer to each other,
   wherein the bottom surface includes a first bottom surface formed in the first conductive layer and a second bottom surface formed in the second conductive layer, a chip being capable of being disposed on the second bottom surface,
   wherein the first inclined side surface includes an upper portion and a lower portion, the lower portion of the first inclined side surface extending from the first bottom surface,
   wherein the second inclined side surface includes an upper portion and a lower portion, the lower portion of the second inclined side surface extending from the second bottom surface,
   wherein the lower portion of the first inclined side surface extends vertically from the first bottom surface and the upper portion of the first inclined side surface extends from the lower portion of the first inclined side surface, and
   wherein a first distance in a horizontal direction between the center of the upper portion of the cavity and the lower portion of the first inclined side surface is larger than a second distance in the horizontal distance between the center of the upper portion of the cavity and the lower portion of the second inclined side surface.

* * * * *